United States Patent [19]

Takahashi

[11] Patent Number: 5,082,762
[45] Date of Patent: Jan. 21, 1992

[54] CHARGED PARTICLE BEAM EXPOSURE METHOD
[75] Inventor: Yasushi Takahashi, Kawasaki, Japan
[73] Assignee: Fujitsu Limited, Kawasaki, Japan
[21] Appl. No.: 425,013
[22] Filed: Oct. 23, 1989
[30] Foreign Application Priority Data
Oct. 24, 1988 [JP] Japan .................... 63-267521
[51] Int. Cl.⁵ .............................................. G03C 5/00
[52] U.S. Cl. ..................... 430/296; 430/328; 430/967
[58] Field of Search ................ 430/296, 328, 967
[56] References Cited
U.S. PATENT DOCUMENTS

| 4,426,584 | 1/1984 | Bohlen et al. | 430/296 X |
| 4,463,265 | 7/1984 | Owen et al. | 250/492.2 |
| 4,712,013 | 12/1987 | Nishimura et al. | 250/492.2 |
| 4,717,644 | 1/1988 | Jones et al. | 430/296 |

OTHER PUBLICATIONS

IBM Technical Disclosure Bulletin, vol. 25, No. 3a, Aug. 1982, New York, U.S. p. 986, N. G. Anantha et al., "Proximity Correction in E-Beam System".

Primary Examiner—Charles L. Bowers, Jr.
Assistant Examiner—Janet C. Baxter
Attorney, Agent, or Firm—Staas & Halsey

[57] ABSTRACT

A method for selectively exposing a resist layer using a charged particle beam to form a desired pattern. The method includes the steps of repeatedly exposing a basic pattern segment using a charged particle beam so as to expose a pattern within a first predetermined region of the resist layer by a main exposure. The pattern within the first predetermined region is a multiple repetition of the basic pattern segment. A second predetermined region of the layer is exposed by auxiliary exposure at an intensity level lower than that of the main exposure. The second predetermined region excludes the central portions of the first predetermined region and includes a region in which a proximity effect occurs due to the main exposure.

20 Claims, 9 Drawing Sheets

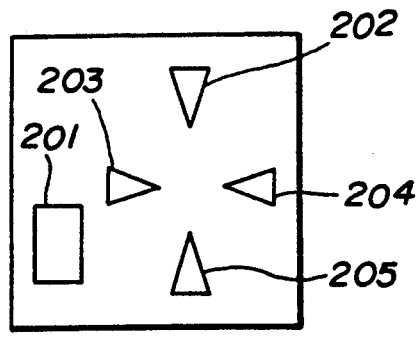
FIG.14
FIG.17
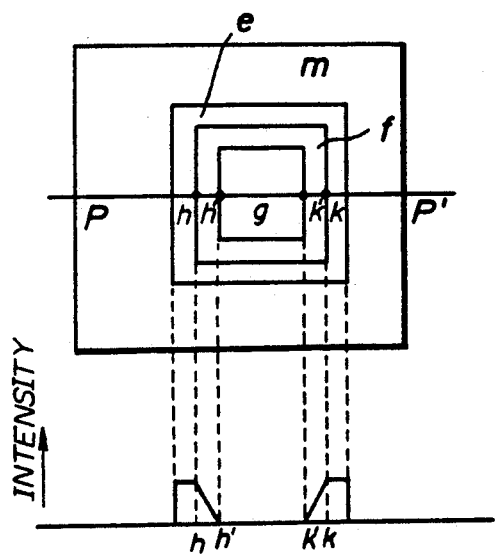
FIG.15A
FIG.15B
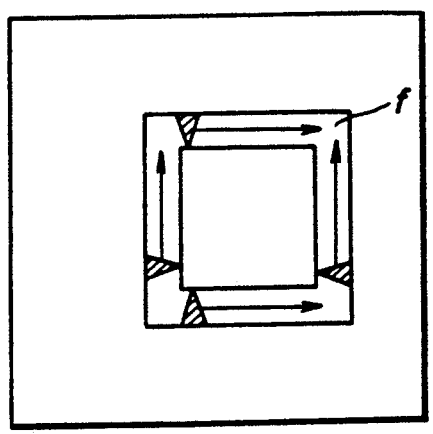
FIG.16

FIG.18A
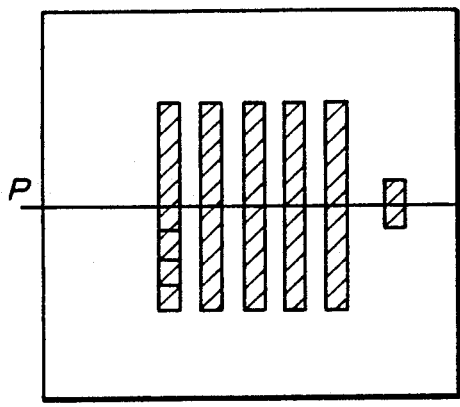
FIG.18D
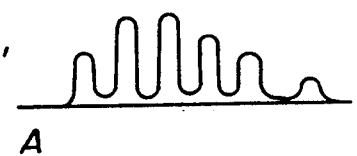
A
FIG.18B
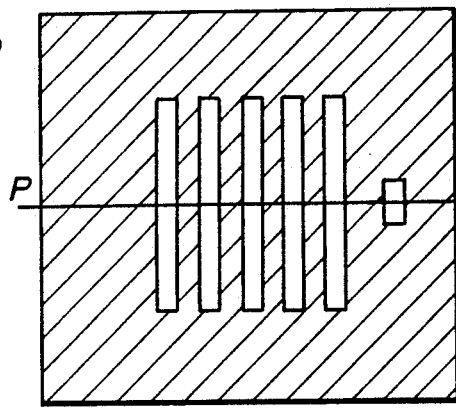
FIG.18E
B
FIG.18F
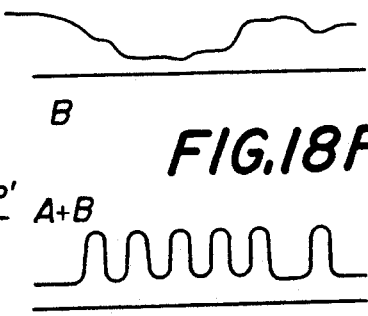
A+B
FIG.18C
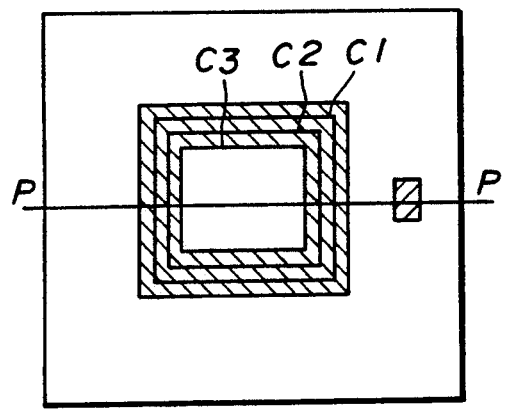
FIG.18G
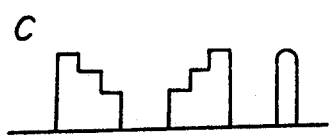
C
FIG.18H
A+C

CHARGED PARTICLE BEAM EXPOSURE METHOD

BACKGROUND OF THE INVENTION

The present invention generally relates to charged particle beam exposure methods, and more particularly to a charged particle beam exposure method which uses a charged particle beam such as an electron beam to selectively expose a resist layer.

Ultraviolet our photolithography was mainly used for forming fine patterns. But recently, due to further increases in the integration density of integrated circuits, new exposure techniques have been developed and and put into practice. The new exposure techniques use charged particle beams such as X-ray beams or electron beams.

Charged particle beam exposure techniques enable the formation of patterns with beams that can be controlled electromagnetically. One notable feature of charged particle beam exposure techniques is the fact that it is thereby possible to form fine patterns of the submicron order. Charged particle beam exposure techniques can generally be categorized into Gaussian beam exposure methods and shaped beam exposure methods.

The trend to further increase the integration density of integrated circuits is rapidly accelerating. As compared to optical beams, the diameter of the minimum spot which can be formed using electron beams is far smaller than that achievable by the optical beam. For this reason, electron beam exposure techniques fully satisfy the demand for increased integration density from the point of view of resolution.

In Gaussian beam exposure methodology, the electron beam is converged to a small spot of a Gaussian distribution and the pattern is drawn by scanning with the spot. The exposure is made by a single strokes of the spot and the time it takes to complete the exposure over a large area becomes longer as the spot is made smaller.

An electron beam can be shaped into fine patterns and the patterned electron beam can be projected within a certain range. The use of such patterned electron beams can considerably increase the speed of forming the desired patterns on the resist layers. The shaped beam exposure techniques such a shaped electron beam. For example, the electron beam may be shaped into a beam with a variable rectangular cross section. A shaped beam with the variable rectangular cross section may be formed by two stages of beam shaping. The electron beam is initially passed through a first square aperture in a first stage, and the shaped electron beam formed in the first square aperture stage is then passed through a second square aperture in a second stage. The variable rectangular cross section of the electron beam can be controlled by the first and second square apertures. There are also proposals for forming the beam into oblong, square, and triangular shapes, and the like, by programming a combination of variable rectangles so that the desired shape can be formed by selecting a program. However, extremely large numbers of variable rectangles are required to achieve complex shapes by combining variable rectangles and it takes that much more time to complete the exposure.

The electron beam itself can be shaped with sufficient accuracy. But when the electron beam is irradiated onto a photo (electron beam) resist layer, forward scattering of the electron beam within the resist layer occurs to a certain extent. Further, when the electron beam hits the base layer, which is made of aluminum, silicon or the like, the electron beam is reflected and further scattering in the form of back scattering occurs in the resist layer. In this case, the backward scattering occurs over a wide range. The spread of the electron beam by scattering can be approximated by the Gaussian distribution as shown in the following formula.

$$F(r) = c1 \exp[-(r/d1)^2] + c2 \exp[-(r/d2)^2]$$

In the above formula, the first term corresponds to the forward scattering, and the second term corresponds to the backward scattering, where r is the distance from the center of the electron beam spot and the parameters c1, c2, d1 and d2 are dependent on the material of the base layer, the kind of resist layer, the acceleration voltage of the electron beam and the like. For example, when a polymethyl methacrylate (PMMA) layer is formed to a thickness of 0.5 microns on a silicon substrate and an electron beam having an acceleration voltage of 20 kV is used, the forward scattering d1 is approximately 1 micron and the backward scattering d2 is approximately 3 microns.

As the integration density increases and the intervals between adjacent exposure patterns become small, the spread of the electron beam caused by the scattering overlaps and affects adjacent patterns, thereby introducing the so-called proximity effect.

The proximity effect is described in conjunction with FIGS. 1A and 1B. In FIG. 1A, when the resist is exposed by an electron beam 111 which has a half-width corresponding to the width d for a separated independent design pattern 101 which has the width d, it is assumed that a developed pattern 121 having the width d is obtained. When the resist is exposed by electron beams 112 and 113 having half-widths which correspond to the width d for closely adjacent design patterns 102 and 103, each having the width d, a synthetic electron beam exposure 114 is obtained at the mutually confronting portions of the design patterns 102 and 103 where the bases of the electron beams 112 and 113 overlap. As a result, the central portion between the design patterns 102 and 103 exceeds the developing level for the resist, and the two design patterns 102 and 103 connect to become exposed as a single pattern 124. When two independent design patterns connect, this results in short-circuiting and the like within the semiconductor device which is produced.

It is possible to raise the developing level as shown in FIG. 1B so that the two peaks of the synthetic electron beam exposure 114 are separated and the two design patterns 102 and 103 are developed as independent patterns 122 and 123. However, even if were possible to adjust a gap g between the two patterns 122 and 123 to the designed value, the width of the pattern 121 or the patterns 122 and 123 becomes smaller than the design value d and the positions of the closely adjacent patterns 122 and 123 also change slightly. When the width of the pattern is smaller than the design value, this results in an increase in the resistance of the conductor path, and conductor breakage occurs due to over heating and the like within the semiconductor device which is produced. On the other hand, changes, in the position of pattern components result in poor contact at contact portions, and increases in stray capacitance and the like within the semiconductor device which is produced.

The proximity effect is the above described phenomenon whereby the dimensions or positions of components of the design pattern are altered due to the presence of the closely adjacent patterns which have an effect on one another.

FIGS. 2A through 2C are diagrams ofr expalining conventional methods of reducing the effects of the proximity effect.

FIG. 2A is a diagram explaining the adjustment needed to compensate for the reduced dimension and position shift. It is assumed that the design patterns 101, 102 and 103 have the same width d and that the two design patterns 102 and 103 are closely adjacent to each other. When the two closely adjacent design patterns 102 and 103 are treated similarly as the design pattern 101, the width of the closely adjacent patterns increases as shown in FIG. 1A and the closely adjacent patterns connect in some cases as a result of the proximity effect. Hence, the first method decreases the width of the closely adjacent patterns depending on the closeness of the closely adjacent patterns. But since the side of the pattern facing the outside is less affected by the proximity, the adjustment is made so that the side of the pattern facing the outside is more separated compared to the side of the pattern facing the inside. In other words, the dimension of the pattern is reduced and the position of the pattern shifts. When the exposure is made by the electron beam, the electron beams 112 and 113 overlap each other at the bases thereof, and the synthetic electron beam 114 develops so that the patterns 122 and 123 have the designed width at the designed position.

FIG. 2B is a diagram for explaining the making of corrections by altering the exposure or intensity of the electron beam. By this method the intensity of the electron beam for the closely adjacent patterns 102 and 103 is reduced. As a result, the synthetic electron beam 114 can maintain approximately the correct interval. But because the intensity of the electron beam is also reduced for the side of the pattern which faces the outside and is less affected by proximity offset, the width of the pattern slightly decreases. In order to maintain the designed width, the position of the pattern is changed slightly. For this reason, this second method is relatively simple when a simple pattern is being formed by Gaussian beam exposure but creates problems in that it is difficult to use this method to accurately reproduce both the designed position and width of the pattern.

FIG. 2C is a diagram for explaining corrections using the ghost exposure method. This method employs a ghost image to expose complementary portions than the design patterns 101, 102 and 103 at an intensity lower than that used for the main exposure of design patterns 101, 102 and 103. Normally, when the intensity of the main exposure is denoted by "1", the intensity of the ghost exposure is in a range of "0.2" to "0.5". A synthetic electron beam exposure 118 which is a combination of the ghost exposure 116 and the main exposure 117 covers the entire surface. At a portion where the patterns are closely adjacent, the patterns affect each other due to the proximity effect. On the other hand, at portions where each pattern is independent and separated from other patterns, the ghost exposure affects the main exposure of the pattern. The added exposure caused by the ghost exposure is small at portions where the patterns are densely arranged because the areas other than those occupied by the patterns are small. In other words, when the differences in the intensities of the main and ghost exposures are not taken into consideration, the same exposure level affects all of the patterns. Even when the difference in the intensities of the main and ghost exposures are taken into account, it is possible to affect all of the patterns by approximately the same exposure level, and the resulting patterns are very accurate. Accordingly, patterns having the desired dimensions as a whole are obtainable. However, the ghost exposure method uses a complete inverted pattern of the original pattern and thus suffers from the fast that the data quantity of the inversion pattern is extremely large and it takes a long time to make the ghost exposure.

A 16-Mbit dynamic random access memory (DRAM) is an example of a semiconductor device which requires super fine patterns. But although the patterns of the DRAM are super fine, most of the areas exposed contain a repetition of the same pattern. Hence, there is a possibility that accurate patterning can be achieved if this repetition of the same pattern is effectively utilized.

It is conceivable to prepare a transmission mask of a basic pattern which becomes a unit of repetition of the patterns, and repeat one-shot exposures using this mask in order to expose the repetition of the same pattern. For example, the basic pattern which is formed in the mask may correspond to one or several cells of the DRAM, one or at least a portion of several cells of a static RAM (SRAM) or the like. The drawing of the repetition of patterns is made by repeating the exposure of the basic pattern from head to tail in single shots and connecting the patterns obtained by each exposure.

The proximity effect is large in the case of the repetition of patterns which are dense. It is possible to consider the proximity effect and shift the dimensions within a single basic pattern. Further, when the basic pattern is repeated to form a large pattern, it is possible to consider the proximity effects on the basic pattern which is located at the central portion caused by the basic patterns located at the periphery. However, although the basic pattern located at the central portion is surrounded by the basic patterns which are located at the periphery, there are no basic patterns surrounding the basic pattern which is located at the periphery. In other words, the proximity effects differ depending on the location of the basic pattern. It is impossible to compensate for the difference in the proximity effects by shifting the dimensions within the basic pattern as long as the same mask is used to expose the basic pattern repeatedly.

The exposure intensity adjustment method can conceivably be employed for each line in the above situation, provided that the basic pattern is formed by a single line and data is prepared beforehand for adjusting the intensity of the exposure depending on the exposure position. However, this exposure intensity adjustment method cannot be employed when the basic pattern is formed by a plurality of lines.

In principle, the ghost exposure method is effective in reducing the proximity effect. However, the number of exposure steps and the exposure time each increase because of the need to also expose all of the non-pattern areas.

Therefore, conventional technology does not provide a method of effectively preventing or reducing the proximity effect by a simple process which does not take much time especially when the patterns are repetitions of basic patterns.

Furthermore, problems similar to those described above also occur when producing reticles and masks.

SUMMARY OF THE INVENTION

Accordingly, it is a general object of the present invention to provide a novel and useful charged particle beam exposure method in which the problems described above are eliminated.

Another and more specific object of the present invention is to provide a charged particle beam exposure method for selectively exposing a resist layer by use of a charged particle beam to form a desired pattern, comprising the steps of repeatedly projecting a basic pattern segment using a charged particle beam so as to expose a pattern within a first predetermined region of the resist layer by a main exposure, where the pattern within the first predetermined region is a multiple repetition of the basic pattern segment, and exposing a second predetermined region of the layer using an auxiliary exposure at a lower intensity level than that of the main exposure. The second predetermined region does not include the central portions of the first predetermined region and does include a marginal region in which a proximity effect occurs due to the main exposure. According to the charged particle beam exposure method of the present invention, it is possible to substantially eliminate the proximity effects by making the auxiliary exposure. Because the auxiliary exposure is only made in the second predetermined region, it is possible to considerably reduce the total exposure time compared to the ghost exposure method described before. For this reason, the throughput can be improved while effectively reducing the proximity effects. The exposure time for the auxiliary exposure can be made to be extremely short especially when electromagnetic wave beam radiation is used for the auxiliary exposure.

Other objects and further features of the present invention will be apparent from the following detailed description when read in conjunction with the accompanying drawings.

BRIEF DESCRIPTION OF THE DRAWINGS

FIGS. 14 through 17 respectively are diagrams for explaining an embodiment of the auxiliary exposure method;

FIGS. 18A through 18H are diagrams for explaining differences between the auxiliary exposure employed in the present invention and the ghost exposure.

DESCRIPTION OF THE PREFERRED EMBODIMENTS

Figure 1A:
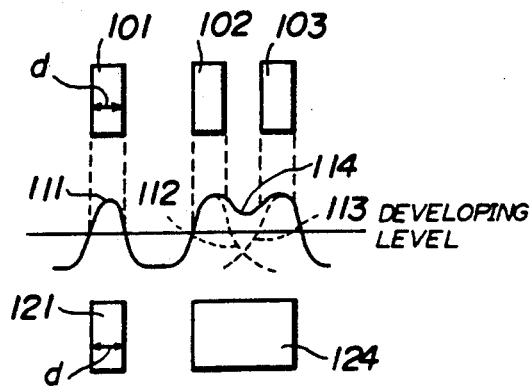
FIGS. 1A and 1B are diagrams for explaining the proximity effect.
Figure 1B:
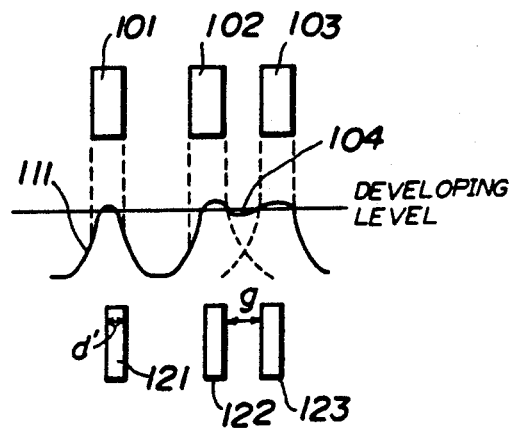
Figure 2A:
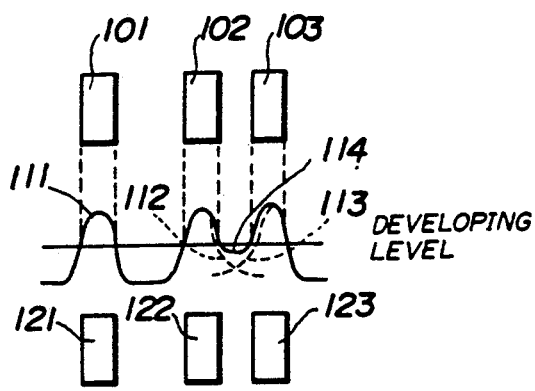
FIGS. 2A through 2C are diagrams for explaining conventional methods for reducing proximity effect.
Figure 2B:
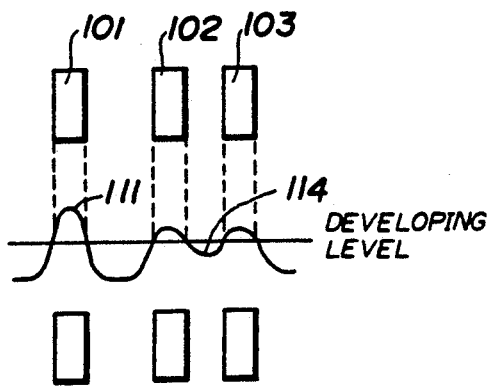
Figure 2C:
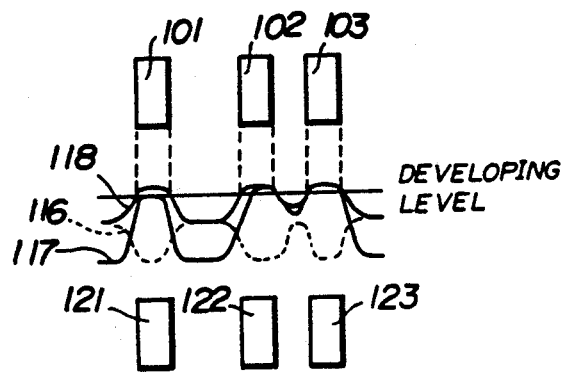
Figure 3:
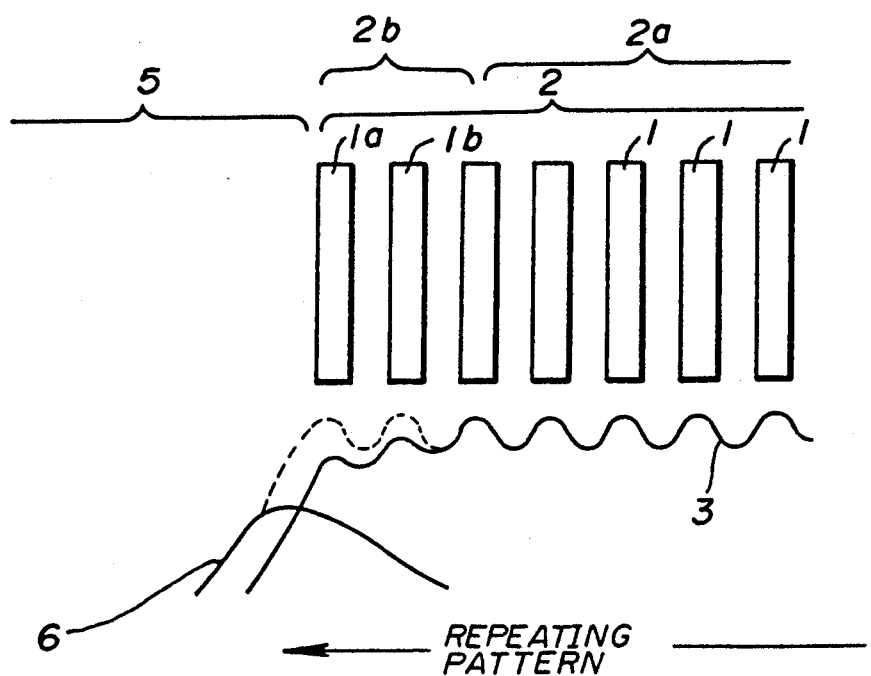
FIG. 3 is a diagram for explaining an embodiment of a charged particle beam exposure method according to the present invention.

A description will be given of an embodiment of a charged particle beam exposure method according to the present invention, by referring to FIG. 3. In FIG. 3, a basic pattern 1 is exposed repeatedly so that the basic pattern is repeated within a predetermined region 2 by a main exposure 3. Then, an auxiliary exposure 6 is made in an outer marginal portion 2b of the region 2 excluding central portion 2a. The auxiliary exposure 6 is made at an intensity which is lower than that of the main exposure 3. For example, the auxiliary exposure 6 may be made in a desired ara by transmitting an electromagnetic wave beam through a transmission mask which is used for the auxiliary exposure.

When exposing the repetition of the basic pattern by the charged particle beam, the proximity effect which occurs in the central portion 2a of the region 2 is approximately uniform and can thus be corrected with ease. However, in the outer marginal portion 2b of the region 2, the proximity effect which occurs is different from that in the central portion 2a because the adjacent patterns are not the same on both sides of the outer marginal portion 2b. In other words, first and second patterns may exist on one side of the outer portion 2b but the first pattern and/or the second pattern may not exist on the other side of the outer portion 2b. Accordingly, the proximity effect which occurs in the outer portion 2b is non-uniform compared to that in the central portion 2a, and the intensity of the exposure is smaller in the outer portion 2b. But in this embodiment, the auxiliary exposure 6 is made at least in the outer portion 2b and if needed also in a peripheral portion 5, so as to compensate for the non-uniform intensity of the main exposure 3 within the outer portion 2b.

The auxiliary exposure 6 is effective even with simple shapes. When the central portion 2a is excluded by a simple pattern and the auxiliary exposure 6 is made at a low intensity, it is possible to effectively reduce the exposure time.

Even in the case where the main exposure 3 is made by repeating the exposure of the basic pattern using a transmission mask of the basic pattern, the proximity effects can be corrected in the central portion 2a of the region 2 at the mask level. The proximity effects in the outer marginal region 2b can be corrected by the auxiliary exposure. As a result, the proximity effects can be corrected as a whole.

The auxiliary exposure 6 simply needs to have a spread corresponding to the proximity effect of the charged particle beam, and the auxiliary exposure 6 can be made with an electromagnetic wave beam. In this case, it is possible to make the exposure time of the auxiliary exposure 6 extremely short.

Next, a more detailed description will be given of this embodiment. In FIG. 3, the basic pattern 1 is drawn by a single line but the basic pattern 1 may have a more complex shape. For example, one basic pattern 1 may correspond to an interconnection pattern of several cells of a dynamic RAM (DRAM). In this case, the pattern of a large portion of the DRAM can be formed by repeatedly exposing the basic pattern 1.

For the sake of convenience, it is assumed that the spread of the charged particle beam corresponds to the total width of two basic patterns 1. Each basic pattern 1 within the central portion 2a of the region 2 is effected by the proximity of two basic patterns 1 which are located on each side of the basic pattern 1. Hence, this proximity effect is taken into consideration when adjusting the design width of the pattern. A basic pattern 1a which is located at the outermost side of the outer portion 2b is effected by the proximity of the two basic patterns 1b and 1 which are located on the right side. However, the basic pattern 1a is not effected by the proximity of another pattern from the left side. The basic pattern 1b which is located in the outer portion 2b is effected by the proximity caused by the two basic patterns 1 which are located on the right side thereof. But the basic pattern 1b is only affected by the proximity caused by one basic pattern 1a which its located on the left side.

Hence, the two patterns in the outer portion 2b become narrow and so the positions of the two patterns are shifted to the right in FIG. 3. The auxiliary exposure 6 is made in the outer portion 2b so as to provide essentially the same effects as if patterns existed on the left side of the outer portion 2b, and an adjustment is made so that the basic patterns 1a and 1b within the outer portion 2b substantially have the designed width and position.

The intensity of the auxiliary exposure 6 is set such that the auxiliary exposure 6 alone does not form the exposure pattern, because the object of the auxiliary exposure 6 is merely to compensate for the proximity effect. Various settings are possible for the intensity of the auxiliary exposure 6 and the extent to which the auxiliary exposure 6 is to affect the patterns. The degree of freedom of the setting is particularly large when the auxiliary exposure 6 is made by use of a charged particle beam. The auxiliary exposure 6 may be made simultaneously in the outer portion 2b and the peripheral portion 5.

Figure 4A:
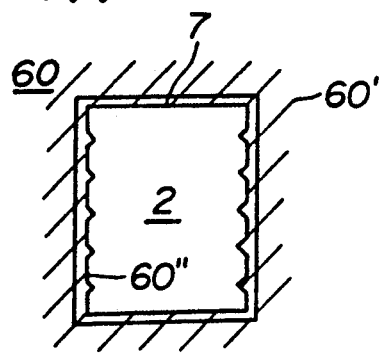
FIGS. 4A and 4B show the relationships between a region exposed by a main exposure and a region exposed by an auxiliary exposure.
Figure 4B:
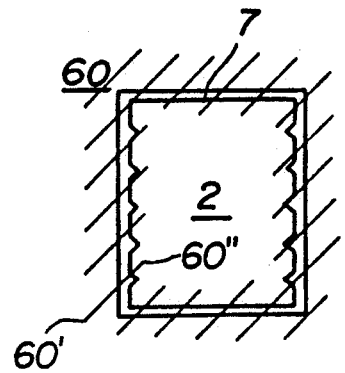

FIGS. 4A and 4B show the relationships of the region 2 exposed by the main exposure 3 and a region 60 exposed by the auxiliary exposure 6. The region 60 exposed by the auxiliary exposure 6 is indicated by hatchings and has an outer peripheral edge 60' and an inner peripheral edge 60". The region 2 is the region in which the repetition of the patterns could be formed, and actual patterns 7 are formed on the inside of a boundary between the regions 2 and 60. Hence, the main exposure 3 and the auxiliary exposure 6 are separated. For example, the region 60 has a hollow rectangular shape. In this case, the auxiliary exposure 6 is made with an intensity which is set depending on the density of the patterns 7 within the region 2.

FIG. 4A shows a case where the edge 60" of region 60 subject to the auxiliary exposure 6 externally touches the boundaries of the pattern 7. Because the edge 60" of region 60 touches the boundary of the pattern 7, it is possible to obtain a strong total exposure effect at the outer periphery of the patterns which are formed by the main exposure 3 even when the intensity of the auxiliary exposure 6 is small. Hence, this case is suited for making an accurate auxiliary exposure by taking into consideration the actual basic pattern to be exposed.

FIG. 4B shows a case where the auxiliary exposure 6 is made in the region 60 having an inner peripheral edge 60" which extends inside the region 2 to a portion of the pattern 7. In this case, the intensity of the auxiliary exposure 6 is suppressed and this case is suited for making an even more accurate proximity effect compensation by taking into account the spread of the charged particle beam. For example, the intensity of the auxiliary exposure 6 is gradually decreased from the outer edge of the pattern 7 which is exposed by the main exposure 3 towards the inside of the pattern 7.

It is evident to those skilled in the art that the relationships of the main exposure 3 and the auxiliary exposure 6 are not limited to those shown in FIGS. 4A and 4B. It is of course possible to use a combination of the relationships shown in FIGS. 4A and 4B, or appropriately change or modify the relationships shown in FIGS. 4A and 4B.

Figure 5A:
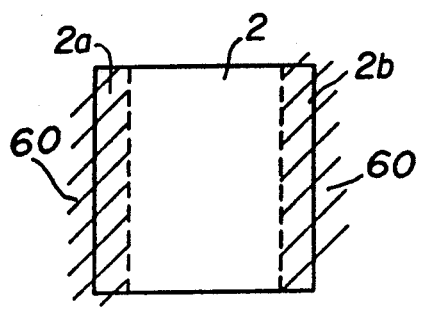
FIGS. 5A and 5B show embodiments of the auxiliary exposure.
Figure 5B:
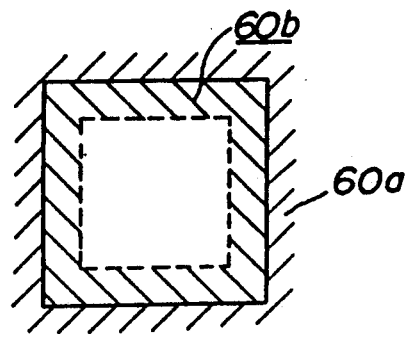

FIGS. 5A and 5B show embodiments of the auxiliary exposure 6.

FIG. 5A shows an embodiment of the auxiliary exposure 6 in which the region 60 does not completely surround the four sides of the region 2 which is exposed by the main exposure 3. For example, in the case of a pattern made up of two parallel lines running in the vertical direction, the proximity effect caused by the mutually adjacent lines cannot be neglected, but the proximity effect caused along the line direction can be deflected in some cases. Furthermore, in this case, the width of the pattern can often be reproduced more accurately when the auxiliary exposure 6 is not made at the top and bottom of the peripheral portion. In the case shown in FIG. 5A, the step of making the auxiliary exposure 6 can be simplified by restricting the region 60 to the opposite, mutually confronting sides 2a, 2b of region 2.

FIG. 5B shows an embodiment of the auxiliary exposure 6 in which the auxiliary exposure 6 is made in two stages. For example, this embodiment is used when the auxiliary exposure 6 extends within the actual exposure pattern 7 as shown in FIG. 4B. The intensity of the auxiliary exposure 6 is larger at an outer portion 60a of the region 60 and smaller at an inner portion 60b of the region 60. For example, the auxiliary exposure 6 with the larger intensity is made in the outer portion 60a to match the forward scattering and the auxiliary exposure 6 with the smaller intensity is made in the inner portion 60b to match the backward scattering. In addition, it is possible to make the outer portion 60a correspond to the peripheral portion 5 shown in FIG. 3 and make the inner portion 60b correspond to the outer portion 2b shown in FIG. 3.

Figure 6B:
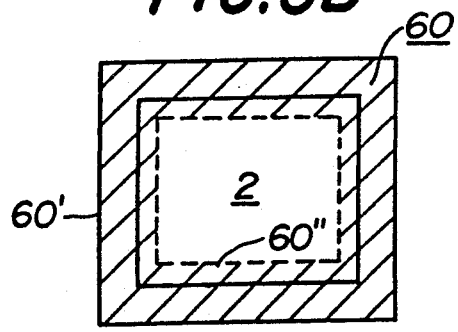
FIGS. 6A and 6B show cases where the region which is exposed by the auxiliary exposure surrounds the region which is exposed by the main exposure.
Figure 6A:
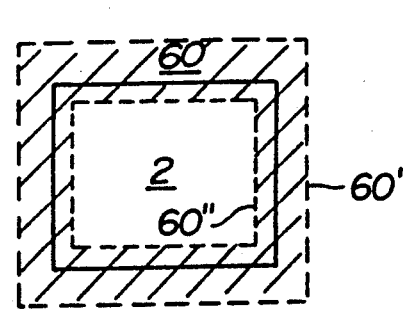

FIGS. 6A and 6B show cases where the region 60 which is exposed by the auxiliary exposure 6 surrounds the region 2 which is exposed by the main exposure 3.

FIG. 6A shows a case similar to FIGS. 4A and 4B described before wherein the region 60 of the auxiliary exposure 6 has an outer limit, that is, the region 60 has a hollow rectangular shape. In FIG. 6A, the phantom lines indicate the outer edges 60' and inner edges 60" of the region 60. Because the proximity effects are limited to a certain width, the auxiliary exposure has no effect at a portion which is separated from the region 2 by more than a predetermined distance. Accordingly, the region 60 in which the auxiliary exposure 6 is made can be limited to a certain width. When an electron beam is used for the auxiliary exposure 6, the exposure time becomes long when the exposure area is large, and for this reason, the limiting of the width of the region 60 is also effective from the point of view of reducing the exposure time of the auxiliary exposure 6.

FIG. 6B shows a case where the auxiliary exposure 6 is made for an entire chip area excluding the central portion 2a of the region 2. The outer edges 60' of region 60 coincide with the outer edges of the chip. When optical exposure is used for the auxiliary exposure, the auxiliary exposure 6 with respect to one chip can be made in one exposure, and the time required to carry out the auxiliary exposure step will not change even when the area of the auxiliary exposure is limited. The optical or photo mask used in this case may in some cases be preferable from the point of view of accuracy.

Figure 7A:
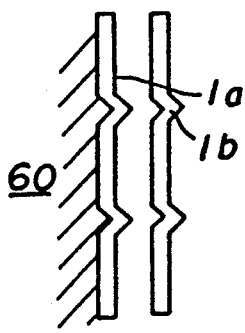
FIGS. 7A through 7C are diagrams for explaining the relationships of two patterns within the region of the main exposure and the region of the auxiliary exposure when the region of the auxiliary exposure is close to or touches the edge of the outer pattern.
Figure 7B:
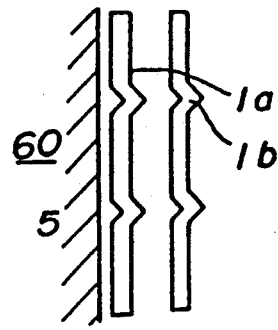
Figure 7C:
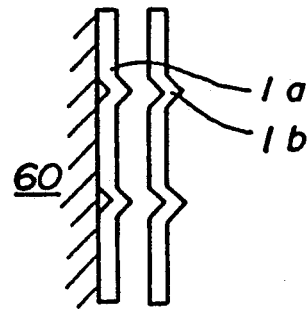

FIGS. 7A through 7C are diagrams for explaining the relationships of the patterns 1a and 1b within the region 2 of the main exposure 3 and the region 60 of the auxiliary exposure 6 when the region 60 is close to or touches the edge of the pattern 1a.

FIG. 7A shows a case where the inner boundary of the region 60 of the auxiliary exposure 6 coincides with the outer edge of the pattern 1a within the region 2 of the main exposure 3.

FIG. 7B shows a case where the inner boundary of the region 60 of the auxiliary exposure 6 is separated from the outer edge of the pattern 1a within the region 2 of the main exposure 3. For example, the auxiliary exposure 6 exposes the region 60 which has a linear shape with respect to the pattern 1a when the pattern 1a includes a fine concavo-convex outer edge. The region 60 may correspond to the peripheral portion 5 shown in FIG. 3.

FIG. 7C shows a case where the inner boundary of the region 60 of the auxiliary exposure 6 touches the outer edge of the pattern 1a within the region 2 but the inner boundary of the region 60 is approximated by a linear boundary by neglecting the fine concavo-convex outer edge of the pattern 1a. In this case, the pattern 1a includes triangular depressions but the inner boundary of the region 60 is a straight line.

FIGS. 8A through 8G are diagrams for explaining the relationships of the patterns 1a and 1b within the region 2 of the main exposure 3 and the region 60 of the auxiliary exposure 6 when the region 60 extends partly into the patterns 1a and 1b.

Figures 8A, 8B, 8F:
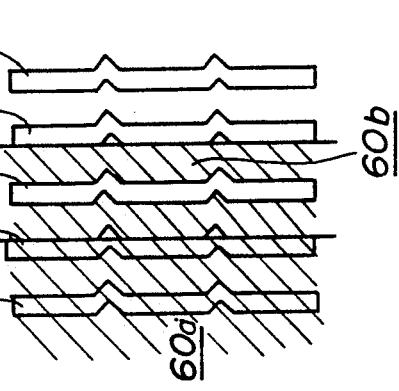
FIGS. 8A through 8G are diagrams for explaining the relationships of two patterns within the region of the main exposure and the region of the auxiliary exposure when the region of the auxiliary exposure extends partly into the patterns.

FIGS. 8A and 8B show cases where the region 60 overlaps the pattern 1a. In FIG. 8A, the inner boundary of the region 60 coincides with the inner edge of the pattern 1a. On the other hand, in FIG. 8B, the inner boundary of the region 60 extends to an intermediate position between the inner edge of the pattern 1a and the outer edge of the pattern 1b.

Figures 8C, 8D, 8E, 8G:
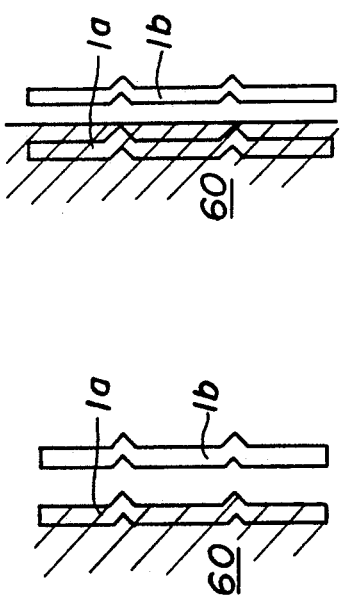

FIGS. 8C, 8D and 8E show cases where the region 60 overlaps a portion of the region 2 but excludes the portions corresponding to the patterns 1a and 1b.

FIG. 8C shows a case where the auxiliary exposure 6 is made in the region 60 which covers all of the regions excluding the patterns 1a and 1b and is shaped to match the patterns 1a and 1b. FIGS. 8D and 8E show cases where the shape of the region 60 is simplified. FIG. 8D shows a case where the edges of the region 60 touching the outer edges of the patterns 1a and 1b are approximated by straight lines. FIG. 8E shows a case where only the edge of the region 60 touching the outer edge of the pattern 1b is approximated by a straight line.

FIG. 8F shows a case where the above are combined. That is, the auxiliary exposure 6 made in a region 60a has a simple approximated shape and covers the patterns 1a and 1b. The auxiliary exposure 6 made in region 60b has a shape in conformance with that of the patterns 1c and 1d and covers these patterns 1c and 1d.

FIG. 8G shows a case where the auxiliary exposure 6 is made over the patterns 1a and 1b in the outer portion 2b.

Next, a description will be given of an electron beam exposure machine for making the main exposure 3 and the auxiliary exposure 6.

Figure 9:
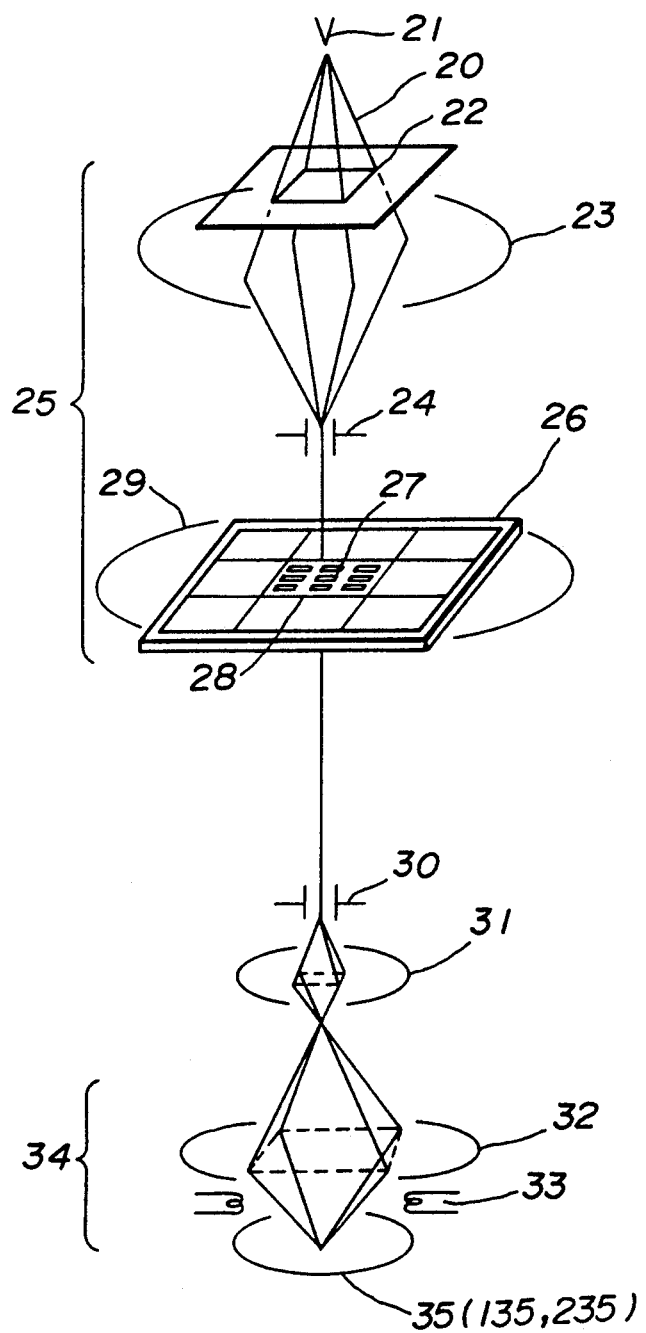
FIG. 9 shows an embodiment of an electron beam exposure machine for making the main exposure.

FIG. 9 shows an embodiment of an electron beam exposure machine which makes the main exposure 3. For example, an electron beam 20 is emitted from an electron gun 21 which includes a $LaB_6$ chip. The electron beam 20 is shaped to have a rectangular cross section by a first aperture 22 and is converged by an electromagnetic lens 23. The converged electron beam is irradiated onto the basic pattern of an arbitrary subsection 28 within one section 27 of a transmission mask 26 by an electromagnetic deflector 24 which is used for selecting the subsection. The patterned electron beam leaving mask 26 is converged on an electromagnetic deflector 30 via an electromagnetic lens 29. Thereafter, the patterned electron beam is irradiated on a reduction electromagnetic lens 31 and exposes a wafer 35 via a deflection system 34 which includes an electromagnetic lens 32 and an electromagnetic deflector 33. The transmission mask 26 also has a variable rectangular aperture (a slit with no pattern) for making non-repetitive patterns.

The first aperture 22 determines the contour of the electron beam 20 so that the shaped electron beam is irradiated only on a single subsection 28 of the transmission mask 26 and not on adjacent subsections of the transmission mask 26.

The electromagnetic deflector 24 deflects the electron beam within one section 27 of the transmission mask 26. For example, a desired basic pattern is selected by deflecting the electron beam 3 mm to 5 mm in one direction on the transmission mask 26.

The electron beam 20 which is patterned by the aperture of the transmission mask 26 is once imaged by the electromagnetic lens 29 and is then reduced for example to 1/100 by the reduction electromagnetic lens 32. The drawing pattern is made fine by the reduction. Accordingly, when a finer pattern needs to be drawn, it is better to use a larger pattern on the transmission mask 26 and make the reduction with a greater reduction ratio. The pattern is deflected by the electromagnetic deflector 33 so as to repeatedly expose the basic pattern.

Figure 10:
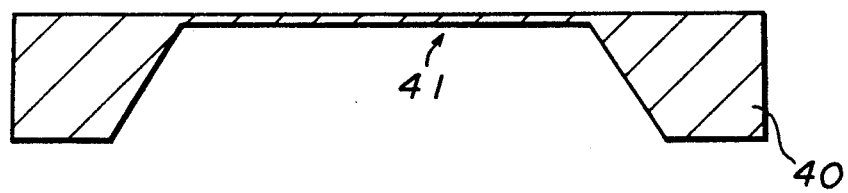
FIG. 10 is a cross sectional view showing a transmission mask used in the electron beam exposure machine of FIG. 9.

As shown in FIG. 10, the transmission mask 26 is formed by making a central portion 41 of a silicon wafer 40 thin in the form of a stencil and forming aperture patterns in the central portion 41. It is of course possible to use a metal plate or the like in place of the silicon wafer 40.

Figure 11:
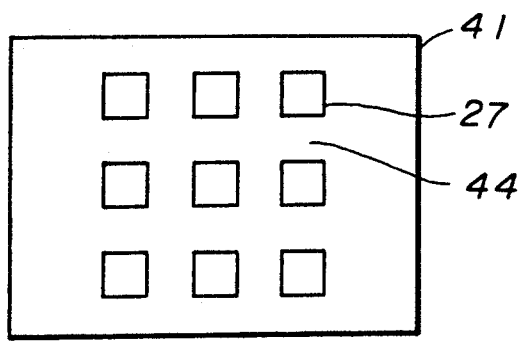
FIGS. 11 through 13 respectively are plan views showing a part of the transmission mask used in the electron beam exposure machine of FIG. 9.

As shown in FIG. 11, the central portion 41 of the transmission mask 26 has a rectangular shape with a side of 30 mm to 50 mm. A plurality of sections 27 are formed within the central portion 41. Each section 27 has a rectangular shape with sides of 3 mm to 5 mm for use as the pattern forming region. Each section 27 has this size by taking into account the range in which the electron beam can be deflected so that there is no need to move a stage which supports the transmission mask 26. A separation region 44 separates two mutually adjacent sections 27.

Figure 12:
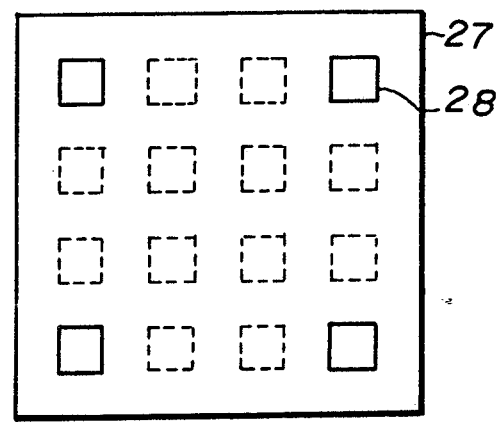

As shown in FIG. 12, the subsections 28 which have rectangular shapes with sides of 200 microns to 500 microns are arranged in a matrix within a given section 27. The four subsections 28a located at the four corners of the section 27 are matching patterns used for positioning purposes. The size of the subsection 28 is determined by the size of the electron beam which can satisfactorily converge, reduce and expose the pattern on the wafer 35.

Figure 13:
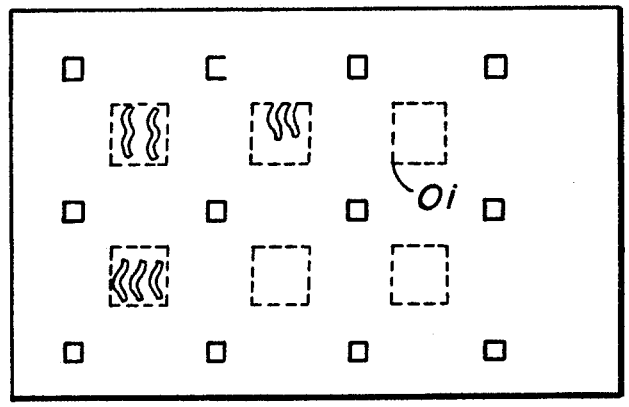

The subsections 28 may be arranged within the section 27 as shown in FIG. 13. In this case, the subsections 28a having the matching pattern for the positioning and the subsections 28b having the patterns to be exposed are alternately arranged as shown. The coordinate of each reference point Oi of the patterns to be exposed can be determined from the matching patterns which are located in a vicinity thereof.

The electron beam exposure machine described above is used to draw the basic pattern 1 within the region 2 of the wafer 35.

For example, in the main exposure step within one chip of the semiconductor device, the basic patterns are exposed repeatedly. For example, a line which is elongated in the vertical direction is exposed by repeatedly exposing the pattern of a vertical line in the vertical direction.

The auxiliary exposure is made before or after the main exposure. For example, it is possible to use the same electron beam exposure machine used for the main exposure when making the auxiliary exposure in the outer portion 2b of the region 2. When an electron beam is used, it is difficult to expose a large area in a single exposure, and for this reason, the region 2 is surrounded by successively repeating the exposure in areas of a certain size. For example, the variable rectangular aperture described above is used and the exposure is made by connecting the rectangular shapes.

Next, a description will be given of an embodiment of the auxiliary exposure methodology.

The auxiliary exposure is made by use of a stencil mask 200 shown in FIG. 14. The stencil mask 200 has aperture patterns 201 through 205. For the sake of convenience, it is assumed that the stencil mask 200 is provided inside the transmission mask 26 shown in FIGS. 9 or 10.

The aperture pattern 201 corresponds to a largest rectangular opening, and it is possible to form the electron beam to have a variable rectangular cross section by a combination of this aperture pattern 201 and the incoming shaped electron beam with the rectangular cross section. The aperture pattern 202 corresponds to an isosceles triangular opening which has its vertex pointing downwardly. The aperture pattern 203 corresponds to an isosceles triangular opening which has a vertex pointing rightwardly. The aperture pattern 204 corresponds to an isosceles triangular opening which has a vertex pointing leftwardly. The aperture pattern 205 corresponds to an isosceles triangular opening which has a vertex pointing upwardly.

FIG. 15A shows a pattern of a predetermined IC chip, where g denotes a central portion of a region in which a basic pattern is repeated, f denotes an outer portion on the outside of the region, and e denotes a peripheral portion with no pattern. For example, the auxiliary exposure is made as follows. That is, an electron beam having a predetermined intensity I1 is passed through the aperture pattern 201 shown in FIG. 14 to shape the electron beam to have a hollow rectangular cross section, and the peripheral portion e is exposed by the shaped electron beam. The central portion g is not exposed. The outer portion f is exposed with such an intensity that the intensity is I1 at the outer periphery and I2 ($=0$) at the inner periphery. The intensity with respect to the outer portion f preferably varies in conformance with a monotone decreasing function. FIG. 15B shows the intensity of the auxiliary exposure in correspondence with a cross section of FIG. 15A taken along a line P-P', where the ordinate indicates the intensity of the auxiliary exposure.

As shown in FIG. 16, the auxiliary exposure with respect to the outer portion f can be made with a varying intensity by taking the following measures. That is, the left side of the outer portion f is scanned from bottom to top by shaping the electron beam to have a triangular cross section by the aperture pattern 203. The top side of the outer portion f is scanned from left to right by shaping the electron beam to have a triangular cross section by the aperture pattern 202. The right side of the outer portion f is scanned from bottom to top by shaping the electron beam to have a triangular cross section by the aperture pattern 204. The bottom side of the outer portion f is scanned from left to right by shaping the electron beam to have a triangular cross section by the aperture pattern 205. By making such an auxiliary exposure, it is possible to obtain an auxiliary exposure distribution (intensity distribution) shown in FIG. 15B by using the change in widths of the aperture patterns 202 through 205 which are triangular openings.

The aperture pattern 202 has the isosceles triangular shape which has the vertex pointing downwardly, but it is possible to use other aperture patterns instead. FIG. 17 shows such aperture patterns 202', 202'' and 202'''. The only requirement for the aperture pattern 202 is that the width of the lower portion must be smaller than that of the upper portion.

In addition, the outer portion f need not be exposed independently. For example, when exposing the peripheral portion e by the electron beam an intentional out of focus state may be generated so as to obtain the auxiliary exposure distribution shown in FIG. 15B. This exposure technique is similar to that used in the ghost exposure.

Next, a description will be given of the differences between the auxiliary exposure employed in the present invention and the ghost exposure, by referring to FIGS. 18A through 18H.

FIG. 18A shows a design pattern. When this design pattern is exposed without making a proximity effect correction, the exposure becomes as shown in FIG. 18D.

FIG. 18B shows a reverse pattern which is exposed by the ghost exposure. This reversed pattern is a reversal of the pattern shown in FIG. 18A. The ghost exposure is made using this reverse pattern with a low beam intensity and with the out of focus state as shown in FIG. 18E. FIG. 18F shows the energy distribution in the resist when the proximity effect correction is made by the ghost exposure. This energy distribution shown in FIG. 18F corresponds to the sum of the exposures shown in FIGS. 18D and 18E.

FIG. 18C shows an embodiment of the auxiliary exposure method employed in the present invention. In this case, the auxiliary exposure is made in the peripheral portion around the outside of the region where the basic pattern is repeated, and also in an isolated pattern I. As shown in FIG. 18G, the auxiliary exposure in the peripheral portion decreases from the outside to the inside. The auxiliary exposure is made in three steps in FIG. 18G, and the auxiliary exposure level is set so that $c_1 > c_2 > c_3$, where $c_1$, $c_2$ and $c_3$ respectively denote the auxiliary exposure levels in regions C1, C2 and C3 shown in FIG. 18C. By this proximity effect correction, the main exposure shown in FIG. 18D and the auxiliary exposure shown in FIG. 18G overlap, and the exposure as a whole becomes as shown in FIG. 18H. Unlike in the ghost exposure method, the exposure time as a whole is substantially reduced because the auxiliary exposure is not made at portions where the auxiliary exposure is unnecessary.

The auxiliary exposure can be realized using an electromagnetic exposure such as photolithography since the pattern exposed by the auxiliary exposure need not necessarily be extremely fine.

Figure 19:
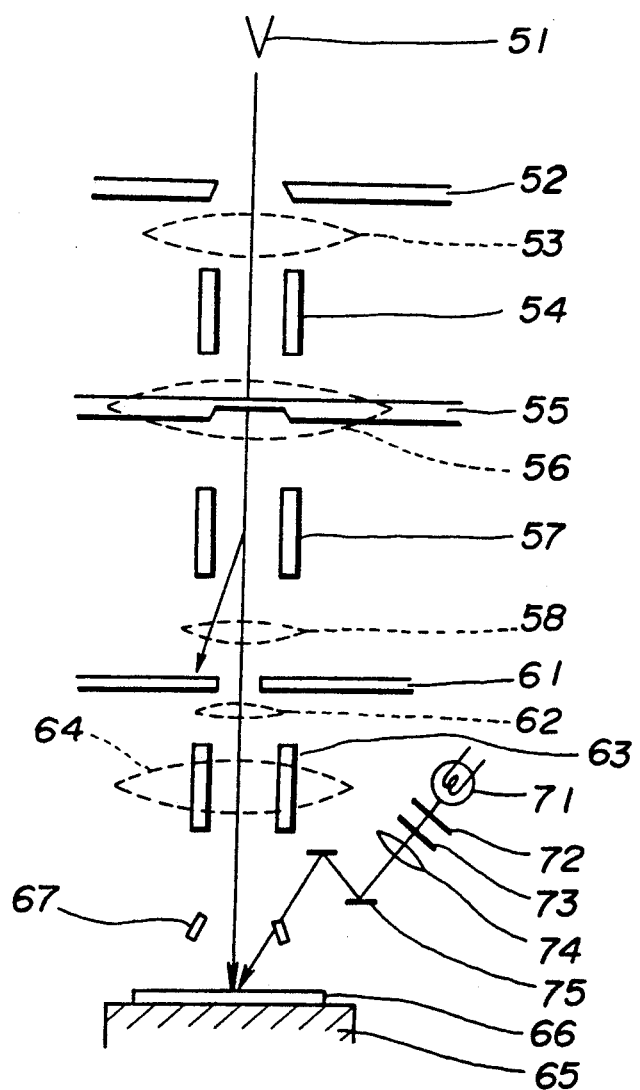
FIG. 19 generally shows an electron beam exposure machine which is provided with an optical exposure system.

FIG. 19 shows the electromagnetic portion of an electron beam exposure machine which is provided with an electromagnetic exposure system. From the side of an electron gun 51 in FIG. 19, a first aperture or slit 52, an electron lens 53, a deflector 54, a transmission mask 55 which has a basic pattern, and an electron lens 56 are provided on an optical axis of an electron lens system so as to constitute a beam shaping part of the basic pattern. For example, the electron lens system generates an electron beam pattern which has a maximum size of 3 microns × 3 microns on the wafer.

A blanking 57 for controlling the ON/OFF state of the electron beam, an electron lens 58, an aperture 61, an electron lens 62, an XY deflector 63, and an electron lens 64 are provided below the beam shaping part. This electron lens system irradiates the converged electron beam on a wafer 66 which is held by a wafer holder of an XY stage 65.

Reflection electrons are emitted from the wafer 66 which is irradiated by the electron beam. A reflection electron detector 67 detects the reflection electrons and detects the surface state of the wafer 66.

An electromagnetic exposure system is provided together with the electron lens system. For the sake of convenience, it is assumed that ultraviolet radiation is used as the electromagnetic radiation. Ultraviolet light is emitted from a mercury lamp 71 and is patterned by way of a shutter 72 and a photo or optical mask 73 which has the pattern for the auxiliary exposure. A mirror optical system 75 irradiates the patterned ultraviolet light onto the surface of the wafer 66.

In FIG. 19, the electromagnetic exposure system is illustrated as irradiating the light at an angle relative to the wafer surface, but it is desirable to irradiate the light perpendicularly to the wafer surface in order to realize an exposure of a high accuracy. In addition, the location of the irradiation light may be different from the location of the electron beam irradiation source. The electromagnetic exposure may be made for a single chip or may be made to simultaneously expose the next chip also.

It is of course possible to employ an electromagnetic exposure system which is independent of the electron beam exposure system.

In the embodiments described heretofore, the present invention is applied to the production of a semiconductor device. However, it is of course possible to similarly apply the present invention to the production of reticles and masks. In this case, as indicated in brackets in FIG. 9, a reticle substrate 135 for producing a reticle is used in place of the wafer 35 or a mask substrate 235 for producing a mask is used in place of the wafer 35. The effects of the present invention when applied to the production of the reticles and the masks are basically the same as those obtainable when the present invention is applied to the production of semiconductor devices.

Further, the present invention is not limited to these embodiments, but various variations and modifications may be made without departing from the scope of the present invention.

What is claimed is:

1. A charged particle beam exposure method for selectively exposing a resist layer by use of a charged particle beam to form a desired pattern, said charged particle beam exposure method comprising the steps of:
   repeatedly projecting a basic pattern segment using a charged particle beam so as to expose a pattern within a first predetermined region of the resist layer by a main exposure, said pattern within said first predetermined region being a multiple repetition of the basic pattern segment; and
   exposing a second predetermined region of the layer using an auxiliary exposure at a lower intensity level than that of said main exposure, said second predetermined region excluding the central portions of said first predetermined region and including marginal portions wherein the proximity effect occurs due to said main exposure.

2. The charged particle beam exposure method as claimed in claim 1 wherein said step of exposing the second region to auxiliary exposure includes exposing the second predetermined region to an electromagnetic wave beam transmitted through a photo or optical mask.

3. The charged particle beam exposure method as claimed in claim 1 wherein said first predetermined region has a rectangular shape.

4. The charged particle beam exposure method as claimed in claim 3 wherein said second predetermined region comprises a first portion which is located at a first side of said first predetermined region and a second portion which is located at a second side of said first predetermined region, said first and second sides being mutually confronting sides of said first predetermined region.

5. The charged particle beam exposure method as claimed in claim 3 wherein said second predetermined region has a hollow rectangular shape presenting an inner peripheral portion that partially overlaps an outer peripheral portion of said first predetermined region.

6. The charged particle beam exposure method as claimed in claim 5 wherein the width of said second predetermined region between the outer and inner peripheral edges thereof is selected in correspondence with the pattern within said first predetermined region.

7. The charged particle beam exposure method as claimed in claim 5 wherein the outer peripheral edge of said second predetermined region coincides with the outer peripheral edge of a semiconductor chip.

8. The charged particle beam exposure method as claimed in claim 1 wherein said second predetermined region has a peripheral edge which coincides with an outer peripheral edge of the pattern within said first predetermined region.

9. The charged particle beam exposure method as claimed in claim 8 wherein said second predetermined region excludes the pattern within said first predetermined region.

10. The charged particle beam exposure method as claimed in claim 8 wherein said second predetermined region partially overlaps the pattern within said first predetermined region.

11. The charged particle beam exposure method as claimed in claim 1 wherein said second predetermined region has a peripheral edge which approximately coincides with an outer peripheral edge of the pattern within said first predetermined region.

12. The charged particle beam exposure method as claimed in claim 11 wherein said second predetermined region excludes the pattern within said first predetermined region.

13. The charged particle beam exposure method as claimed in claim 11 wherein said second predetermined region partially overlaps the pattern within said first predetermined region.

14. The charged particle beam exposure method as claimed in claim 1 wherein said second predetermined region has an inner peripheral edge which is positioned to present a predetermined gap between said inner edge and an outer peripheral edge of the pattern within said first predetermined region.

15. The charged particle beam exposure method as claimed in claim 14 wherein said second predetermined region excludes the pattern within said first predetermined region.

16. The charged particle beam exposure method as claimed in claim 14 wherein said second predetermined region partially overlaps the pattern within said first predetermined region.

17. The charged particle beam exposure method as claimed in claim 1 wherein the intensity level of the auxiliary exposure decreases in a direction toward said control portions of said first predetermined region.

18. The charged particle beam exposure method as claimed in claim 1 wherein said step of repeatedly exposing the basic pattern segment includes the step of exposing the basic pattern segment onto a substrate which has a resist layer formed thereon, said substrate being adapted for use in the production of a semiconductor device.

19. The charged particle beam exposure method as claimed in claim 1 wherein said step of repeatedly exposing the basic pattern segment includes the step of exposing the basic pattern segment onto a substrate which has the resist layer formed thereon, said substrate being adapted for use in producing a reticle.

20. The charged particle beam exposure method as claimed in claim 1 wherein said step of repeatedly exposing the basic pattern segment includes the step of exposing the basic pattern segment onto a substrate which has the resist layer formed thereon, said substrate being adapted for use in producing a mask.

* * * * *

UNITED STATES PATENT AND TRADEMARK OFFICE
CERTIFICATE OF CORRECTION

PATENT NO.   :   5,082,762
DATED        :   January 21, 1992
INVENTOR(S)  :   YASUSHI TAKAHASHI It is certified that error appears in the above-identified patent and that said Letters Patent is hereby corrected as shown below:

```
Column 1, line 11, "our" should be --(UV)--;
          line 45, after "techniques" insert --use--.

Column 2, line 40, after "the" insert --respective--;
          line 41, after "portions" insert "112a and 113a".

Column 3, line 7, delete "the effects of";
          line 50, after "portions" insert --other--;
          line 63, after "pattern" insert --by adding
                   thereto--.

Column 6, line 29, "ara" should be --area--.
```

Signed and Sealed this

Seventh Day of July, 1992

*Attest:*

DOUGLAS B. COMER

*Attesting Officer*    Acting Commissioner of Patents and Trademarks